United States Patent [19]

Kaszubinski et al.

[11] Patent Number: 4,723,225
[45] Date of Patent: Feb. 2, 1988

[54] PROGRAMMING CURRENT CONTROLLER

[75] Inventors: Jeffrey K. Kaszubinski, Houston; Debra J. Dolby, Missouri City; Timmie M. Coffman, Sugar Land; John F. Schreck, Houston, all of Tex.

[73] Assignee: Texas Instruments Incorporated, Dallas, Tex.

[21] Appl. No.: 786,981

[22] Filed: Oct. 15, 1985

[51] Int. Cl.⁴ ............................................. G11C 11/34
[52] U.S. Cl. ..................................... 365/185; 365/203
[58] Field of Search .............. 365/182, 185, 203, 230, 365/104; 357/23.5

[56] References Cited

U.S. PATENT DOCUMENTS 4,387,447  6/1983  Klaas et al. ........................ 365/203

Primary Examiner—Joseph A. Popek
Attorney, Agent, or Firm—Robert Groover, III; John G. Graham; Rodney M. Anderson

[57] ABSTRACT

An electrically programmable semiconductor memory device of a type having an array of programmable semiconductor floating gate transistors sets of which are coupled between associated respective source and drain lines, an array programming control transistor and a ground select transistor coupled to each of the drain and source lines. Each selected floating gate transistor in a programming mode is in series with control and ground select transistors between a high voltage Vpp and ground potential. A resistive element in series with a first conducting circuit element establishes a reference current which generates a voltage $V_1$ at the junction of the resistive element and the circuit element. In a second current leg a second conducting circuit element, a module floating gate transistor biased into a conducting state and a module control transistor are all connected between Vpp and ground such that a voltage $V_2$ is established at the junction of the second circuit element and the module floating gate transistor. Comparing means compares voltages $V_1$ and $V_2$ and adjusts the gate voltage $V_3$ of the module programming control transistor so as to make the voltage $V_2$ equal to voltage $V_1$ and applies voltage $V_3$ to the gates of the array programming control transistors. Since the transistor in the reference path is both electrically and geometrically the same as that in the second leg across which the voltage developed is compared, and is made by the same process, the current in the second leg will be substantially the same as that in the reference leg. Moreover, since the array floating gate transistors are also made by the same process as is the module floating gate transistor and the programming control and ground select transistors are also identical, by feeding the voltage $V_3$ to array control transistors substantially the same current will flow through a selected array transistor as flows through both the reference current path and the second current leg.

19 Claims, 4 Drawing Figures

PROGRAMMING CURRENT CONTROLLER

BACKGROUND

The present invention relates to a programming current controlling method and device for an electrically erasable programmable semiconductor memory cell. The invention is directed, more particularly, to a programming current controlling device which is formed on a chip containing a plurality of such memory cells in an array.

The programming current for an EPROM depends both on circuit elements coupled to the EPROM cell as well as on the characteristics of the EPROM cell itself. Since the programming load line normally chosen passes through a steeply sloped portion of the curve and is itself steeply sloped any relatively small variation in the curve results in a relatively significant variation in programming current. The programming current must be maintained between an $I_{MIN}$ value determined by the minimum current required to program the EPROM cell and $I_{MAX}$ set by the $I_{pp}$ specification. In the case of low programming current long programming times result whereas high programming currents may fail the specification for maximum allowable programming current.

Advances in EPROM bit density have resulted in a trend towards shorter programming pulses per byte to minimize end user programming time per device. Because the programming time is directly proportional to the programming current there is a conflicting requirement between the need for faster programming time and the requirement to limit the maximum source/drain current to keep it below the specification maximum.

It is therefore an object of the present invention to provide an improved method and apparatus for controlling the programming current in an array of EPROMS. It is a further object of the present invention to provide an EPROM memory device the programming of which is substantially independent of the variations in its fabrication process.

SUMMARY OF THE INVENTION

According to the invention there is provided an electrically programmable semiconductor memory device of a type having an array of programmable semiconductor floating gate transistors sets of which are coupled between associated respective source and drain lines, an array programming control transistor and a ground select transistor coupled to each of the drain and source lines. Each selected floating gate transistor in a programming mode is in series with control and ground select transistors between a high voltage Vpp and ground potential. A resistive element in series with a first conducting circuit element establishes a reference current which generates a voltage $V_1$ at the junction of the resistive element and the circuit element. In a second current leg a second conducting circuit element, a module floating gate transistor biased into a conducting state and a module control transistor are all connected between Vpp and ground such that a voltage $V_2$ is established at the junction of the second circuit element and the module floating gate transistor. Comparing means compares voltages $V_1$ and $V_2$ and adjusts the gate voltage $V_3$ of the module programming control transistor so as to make the voltage $V_2$ equal to voltage $V_1$ and applies voltage $V_3$ to the gates of the array programming control transistors. Since the transistor in the reference path is both electrically and geometrically the same as that in the second leg across which the voltage developed is compared, and is made by the same process, the current in the second leg will be substantially the same as that in the reference leg. Moreover, since the array floating gate transistors are also made by the same process as is the module floating gate transistor and the programming control and ground select transistors are also identical, by feeding the voltage $V_3$ to array control transistors substantially the same current will flow through a selected array transistor as flows through both the reference current path and the second current leg.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 1:
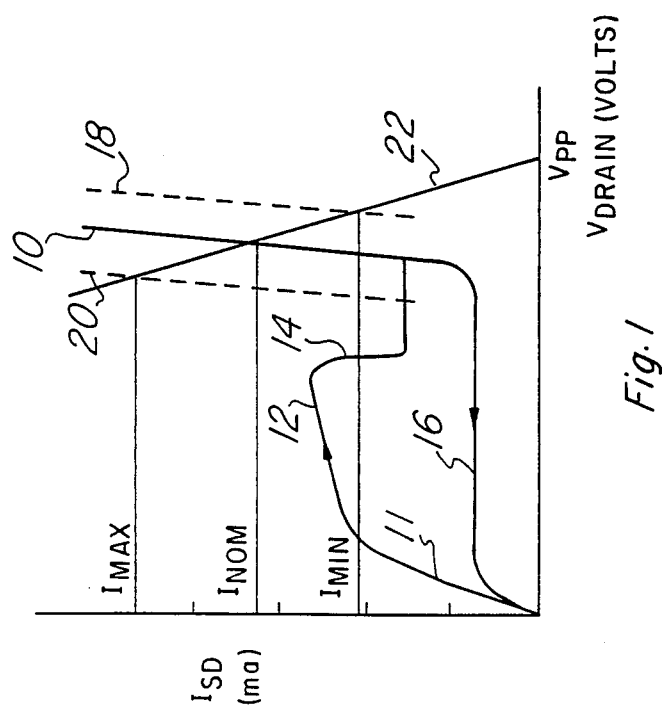
FIG. 1 is a characteristic curve of the source/drain voltage versus source/drain current for a typical EPROM cell together with a typical programming load line.

Referring to FIG. 1 there is shown a typical characteristic of the source/drain voltage versus the source/drain current of an EPROM memory cell. The forward path in the linear region 11, exhibits a rapid initial current rise with increasing voltage enters the saturation region 12 and then drops off rapidly at 14 where programming begins. The drain current stays flat for a few volts and there is a sudden large linear increase in current with increasing voltage 10. The return path follows path 10, then the long horizontal portion 16 before dropping to zero current. A typical load line 22 is also shown in which a high voltage $V_{pp}$ is applied through a programming load device. For the example shown the nominal operating point or programming current is Inom.

Shown in FIG. 1 is a typical variation range of path 10 as a result in the production tolerances of the device. Path 10 is a function of the channel length of the memory cell and is subject to up to a 2 volt variation. This will cause a range of cell programming currents from $I_{MIN}$ to $I_{MAX}$. This change in programming current will directly affect programming time. Such a large variation in programming time creates severe production problems in terms of low yield and associated marketability. For the low current end the programming time is excessively long while for the higher current the maximum allowable programming current will be exceeded.

Figure 2:
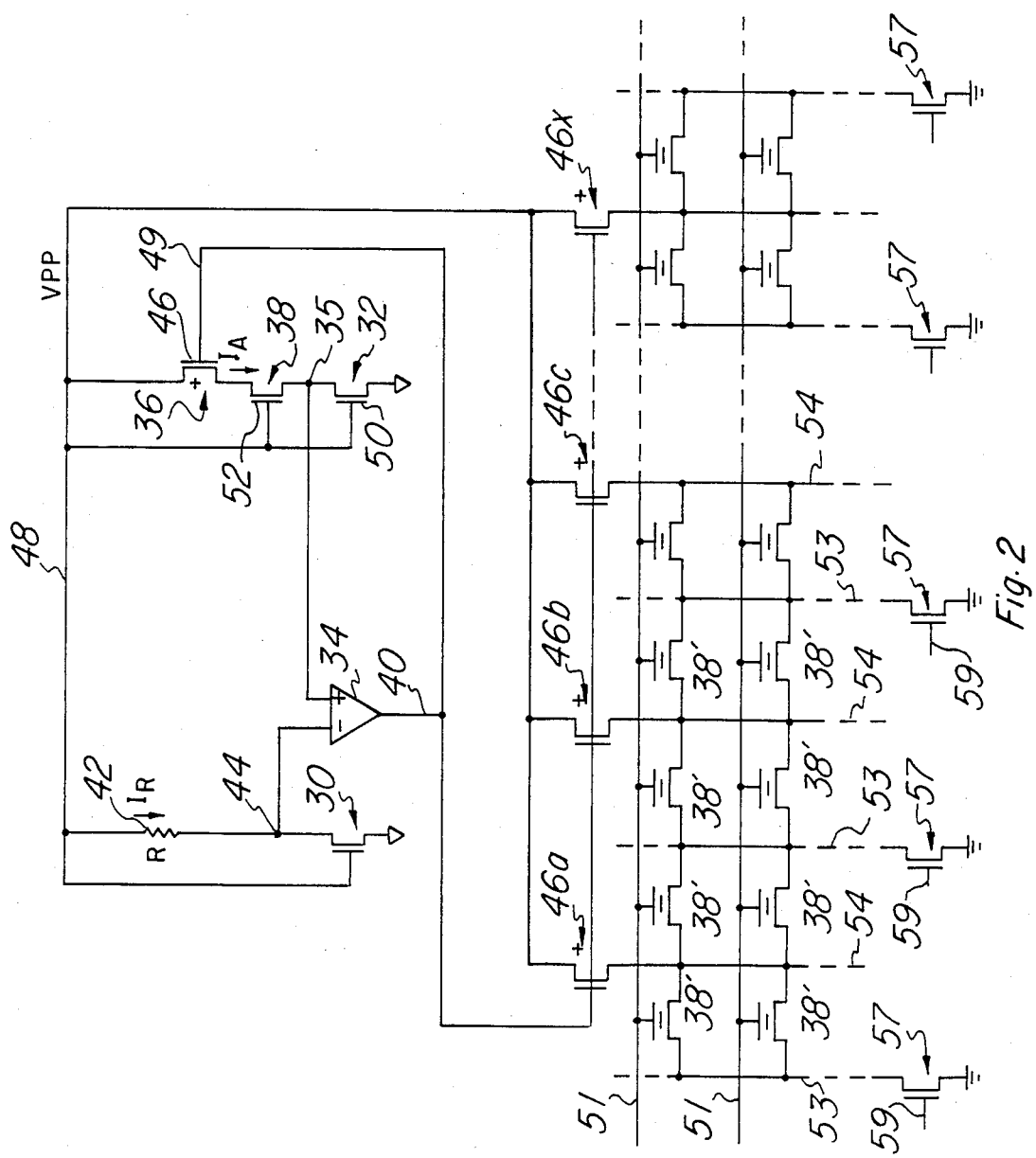
FIG. 2 is a schematic circuit diagram of EPROM programming current controller shown as coupled to an array of EPROM cells.

A programming current controller as shown in FIG. 2 includes a resistive element 42 in a reference current leg in series with a reference ground select transistor 30 which is biased on by having its gate connected to the high voltage line Vpp 48. As a consequence of a reference current $I_R$ being established through transistor 30, a voltage $V_1$ will be established at junction 44.

In a second current leg, a module programming control P-channel field effect transistor 36 is in series with a module floating gate transistor 38 and an N-channel control select field effect transistor 32 identical to transistor 30, coupled between line 48 and ground. Both the transistor 38 and the transistor 32 are biased on by having their control gate 52 and gate 50, respectively, connected to line 48. The current $1_A$ is controlled by the module programming control transistor 36 and in flowing through the control select transistor 32 develops a voltage $V_2$ at junction 35. Junction 44 is coupled to the inverting input of comparator 34 while junction 35 is connected to the non-inverting input thereof. The comparator output 40 is coupled to the gate 46 of module programming control transistor 36 as well as being coupled to gates of matching array control transistors 46a, 46b, 46c, etc. Each of the programming control transistors 46a, 46b, etc. are coupled to corresponding column lines 54 each one of which connects to a parallel array of floating gate transistors 38'. The other end of the parallel array of transistors 38' are connected to corresponding decoded ground lines 53 each of which is coupled to ground through a ground select transistor 57 the gates of which 59 are used to select the active ground line. In operation reference ground select transistor 30 being in a conductive state causes a current $I_R$ to flow through resistive element 42 the value of which is determined by Vpp less the voltage across transistor 30 divided by the value of resistance of element 42. As a result of current $I_R$ flowing a voltage V1 at junction 44 is developed which is applied to the inverting input of comparator 34. In the second current leg a current $I_A$ flows and as a result of passing through transistor 32 causes a voltage $V_2$ to be present at junction 35. The comparator output 40 swings the voltage on the gate 46 of transistor 36 to a value $V_3$ such that $I_A$ becomes substantially equal to the reference current $I_R$. This same value of $V_3$ is also applied to the gates of transistors 46a, 46b, etc.. For the selection of a given row line 51 made by raising the voltage of that line to Vpp, there will be in series a given one of transistors 46a, 46b, etc., an associated one of floating gate transistors 38', and an associated one of ground select transistors 57. The latter three circuit elements are the same as those in series in the second leg of current module 49. Since the transistors in module 49 are made by the same process as those in the array, the application of voltage $V_3$ to the gates of transistors 46a, 46b, etc. will result in substantially the same programming current in the array as $I_A$. Thus, the $1_A$ programming current for transistors 38' in the array is determined by the reference current $I_R$ which, in turn, is primarily a function of resistance R of resistive element 42. The latter can be made to relatively close tolerances and can be in the form of a bipolar transistor, N-channel or P-channel MOS transistor, or a diffusion or polysilicon resistor.

Figure 3:
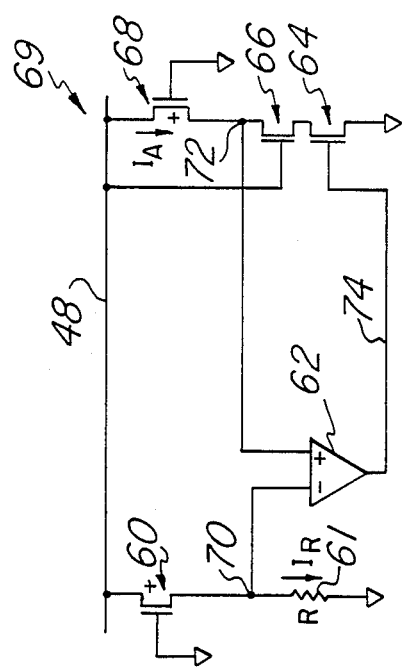
FIG. 3 is a schematic circuit diagram of the EPROM programming current controller.

An alternative form of a module as shown in FIG. 3 consists of a reference current leg made up of a reference ground select P-channel transistor 60 in series with a resistor 61 with the transistor 60 biased on by connection of its gate to ground thus establishing a reference current $I_R$. The second leg consists of a P-channel control select transistor 68 in series with a floating gate transistor 66 biased on and a module programming control transistor 64 coupled to ground. Junction 70 of transistor 60 and resistive element 61 is coupled to the inverting input of a comparator 62 while junction 72 of transistor 68 and floating gate transistor 66 is connected to the non-inverting input of comparator 62. The output 74 of comparator 62 is coupled to a gate of module control transistor 64.

The operation of the circuit of FIG. 3 is substantially the same as that of FIG. 2 except the voltages across the P-channel transistors 60 and 68 are compared rather than N-channel transistors and the module control transistor 64 is an N-channel transistor rather than a P-channel transistor. The circuit elements in the array in this case would correspond to those in the second leg of the current module 69.

Figure 4:
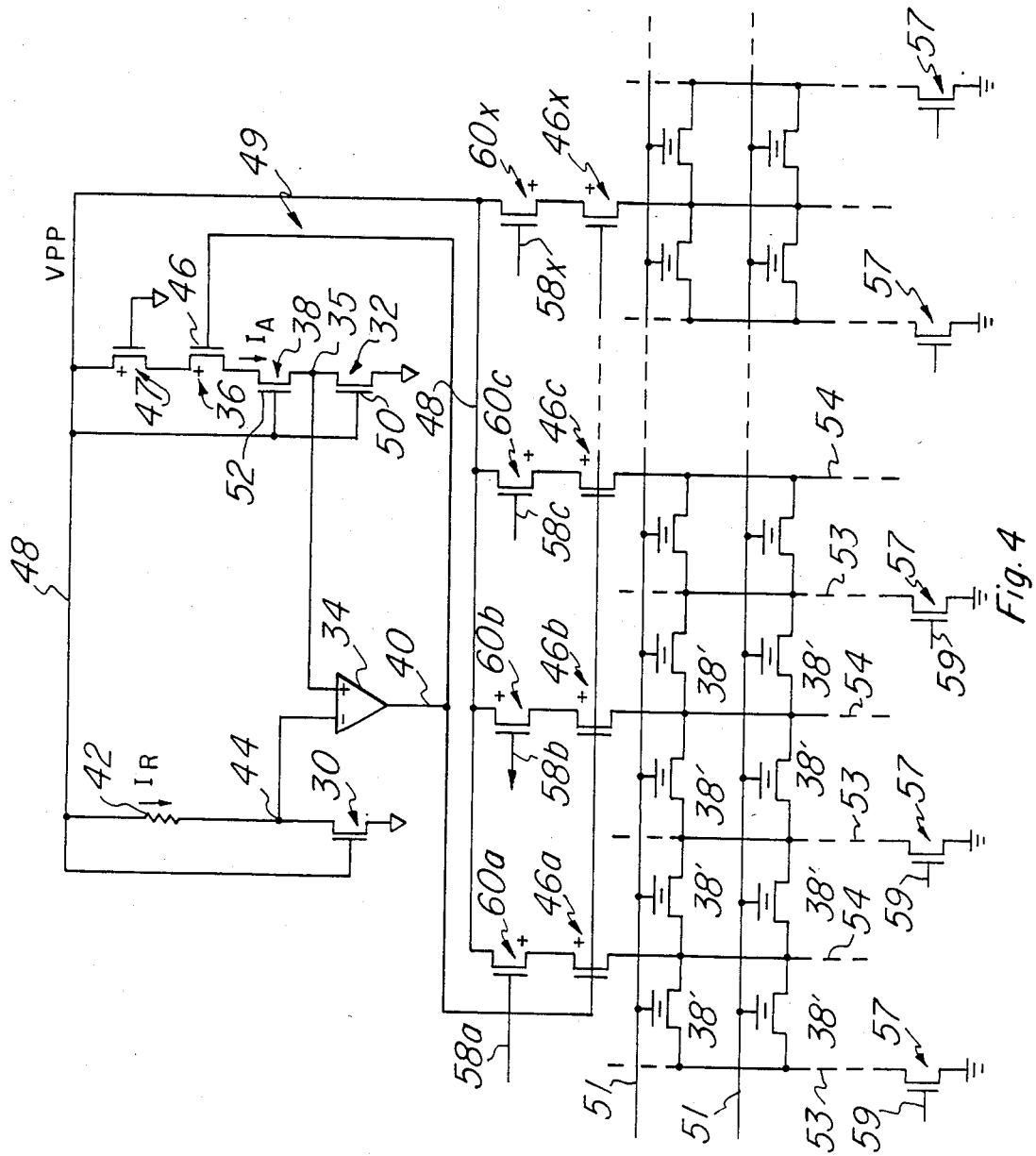
FIG. 4 is a schematic circuit diagram of an alternative programming current controller with column select transistors.

The array of FIG. 2 may be modified as shown in FIG. 4 by introducing column select transistors 60a, 60b, 60c ... etc., in respective columns 54 between $V_{pp}$ line 48 and respective transistors 46a, 46b, etc. and P-channel transistor 47 in series with P-channel transistor 36. An appropriate one or more of column lines 54 are selected by driving the gates 58 of column select transistors 60 low. Otherwise the operation of the circuit of FIG. 4 is the same as that of FIG. 2. Transistor 47 is used to make the second leg identical to each column of the array.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. An electrically programmable semiconductor memory device of a type having an array of floating gate transistors, sets of which are coupled between associated respective source and drain lines, an array programming control transistor and a ground select transistor coupled to each of said drain and source lines such that each selected floating gate transistor in a programming mode is in series with said control and ground select transistors between a high voltage $V_{pp}$, and ground potential, comprising:
   a resistive element in series with a first conducting circuit element connected between $V_{pp}$ and ground whereby a voltage $V_1$ is established at the junction of said resistive element and said first conducting circuit element;
   a second conducting circuit element and a module floating gate transistor each biased into a conducting state and a module programming control transistor all connected in series between $V_{pp}$ and ground, whereby a voltage $V_2$ is established at the junction at said second circuit element and said module floating gate transistor; and
   means for comparing $V_1$ and $V_2$ and generating a gate voltage $V_3$ for said module control transistor so as to make the voltage $V_2$ equal to $V_1$ and applying $V_3$ to the gates of said array control transistors.

2. A memory device according to claim 1, wherein said first conducting circuit element and said second conducting circuit element are reference select and control select transistors, respectively, each biased into a conducting state.

3. A memory device according to claim 2, wherein said comparing means is a comparator having one input coupled to the junction of said resistive element and said reference select transistor, another input coupled to the juction of said control select transistor and said module floating gate transistor and an output coupled to the gate of said module programming control transistor and to said array programming control transistors.

4. A memory device according to claim 3, wherein said memory device is formed in a face of a silicon substrate.

5. A memory device according to claim 4, wherein said array programming control and floating gate transistors are made by the same process as said module programming control and module floating gate transistors.

6. A memory device according to claim 3, wherein said module programming control and array programming control transistors are P-channel field effect transistors.

7. A memory device according to claim 6, wherein said module programming control and array programming control transistors are N-channel field effect transistors.

8. A memory device according to claim 3, wherein said resistive element is a bipolar transistor.

9. A memory device according to claim 3, wherein said resistive element is a diffusion resistor.

10. A memory device according to claim 3, wherein said resistive element is a polysilicon resistor.

11. A memory device according to claim 3, wherein said resistive element is a MOS transistor.

12. A method for controlling the programming current of an array of floating gate electrically programmable read only memory transistors, comprising:
  establishing a desired reference current;
  comparing a voltage V1 developed by said reference current across a circuit element to a voltage V2 developed across a similar circuit element in another current path having similar circuit elements as those circuit elements in a path of a selected one of said array floating gate transistors;
  generating a control signal V3 with a magnitude proportional to the difference of V2 and V1 and a polarity corresponding to the polarity of the difference;
  and applying V3 to a gate of an array programming control transistor in series with the selected array floating gate transistor so as to maintain the current through the selected floating gate transistor substantially equal to the reference current.

13. A method according to claim 12, wherein the circuit element in a current path of said reference current which is the same as a corresponding circuit element in said another path is a field effect transistor.

14. A method according to claim 13, wherein the circuit elements in said another current path in addition to a field effect transistor is an electrically programmable floating gate transistor and a second field effect transistor.

15. A method according to claim 14, wherein circuit elements in the current path of said reference current include a resistive element in series with the field effect transistor which is biased into a conducting state.

16. A method according to claim 15, wherein said resistive element is a bipolar transistor.

17. A method according to claim 15, wherein said resistive element is a diffusion resistor.

18. A method according to claim 15, wherein said resistive element is a polysilicon resistor.

19. A method according to claim 15, wherein said resistive element is a MOS transistor.

* * * * *